United States Patent
Baks et al.

(10) Patent No.: US 7,539,366 B1
(45) Date of Patent: May 26, 2009

(54) OPTICAL TRANSCEIVER MODULE

(75) Inventors: Christian Wilhelmus Baks, Poughkeepsie, NY (US); Fuad Elias Doany, Katonah, NY (US); Clint Lee Schow, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/969,374

(22) Filed: Jan. 4, 2008

(51) Int. Cl.
*G02B 6/12* (2006.01)
*G02B 6/36* (2006.01)

(52) U.S. Cl. .............................. 385/14; 385/33; 385/88; 385/92; 385/93

(58) Field of Classification Search ................ 385/14, 385/33, 88–94
See application file for complete search history.

(56) References Cited

U.S. PATENT DOCUMENTS

| | | | |
|---|---|---|---|
| 5,687,267 A | 11/1997 | Uchida | |
| 6,396,116 B1 * | 5/2002 | Kelly et al. | 257/432 |
| 6,843,608 B2 | 1/2005 | O'Connor et al. | |
| 6,897,485 B2 * | 5/2005 | Kropp | 257/80 |
| 6,910,812 B2 * | 6/2005 | Pommer et al. | 385/92 |
| 7,084,496 B2 | 8/2006 | Benner et al. | |
| 7,118,293 B2 | 10/2006 | Nagasaka et al. | |
| 7,205,646 B2 * | 4/2007 | Lin et al. | 257/686 |
| 7,239,767 B2 * | 7/2007 | Kim et al. | 385/14 |
| 2003/0185526 A1 | 10/2003 | Hohn et al. | |
| 2005/0141825 A1 | 6/2005 | Lee et al. | |
| 2005/0180679 A1 | 8/2005 | Shimizu et al. | |
| 2005/0249450 A1 | 11/2005 | Schrodinger | |
| 2005/0254758 A1 | 11/2005 | Kropp | |

* cited by examiner

*Primary Examiner*—Sung H Pak
*Assistant Examiner*—Daniel Petkovsek
(74) *Attorney, Agent, or Firm*—Yee & Associates, P.C.; Anne V. Dougherty

(57) ABSTRACT

An optical module. The optical module includes a printed circuit board and an opto-chip. The opto-chip includes a transparent carrier with an optoelectronic device array and an associated integrated circuit array that are flip chip attached to the transparent carrier. The optoelectronic device array and the associated integrated circuit array are interconnected via surface wiring with bond sites. In addition, the associated integrated circuit array extends beyond the transparent carrier to provide direct flip chip attachment of the opto-chip to the printed circuit board.

12 Claims, 5 Drawing Sheets

OPTICAL TRANSCEIVER MODULE

This invention was made with Government support under Contract No.: MDA972-03-3-0004 awarded by Defense Advanced Research Projects Agency (DARPA). The Government has certain rights in this invention.

BACKGROUND OF THE INVENTION

1. Field of the Invention

The present invention relates generally to an improved data processing system. More specifically, the present invention is directed to an optical transceiver module that utilizes a transparent carrier and one or more integrated circuits, which are attached to both the transparent carrier and a package.

2. Description of the Related Art

Today, separate 12-channel parallel optical transmitter and receiver modules are available that operate at up to five gigabits per second (Gb/s) per channel. These optical modules are based on one-dimensional (1×12) arrays of photodiodes and vertical cavity surface emitting lasers (VCSELs), which are typically manufactured on gallium arsenide (GaAs) or indium phosphoride (InP) substrates. Current packaging technology consists of mounting optoelectronic (OE) arrays and analog amplifier integrated circuits (ICs) in close proximity and then establishing an electrical contact between the OEs and ICs with wire bonds.

However, this current packaging approach limits both the density and the speed of these optical modules. The density of these modules is limited because of the requirements for relatively large wire bond pads and because these modules are typically incorporated only on the perimeter of the chip. Further, the speed of these modules is adversely impacted by electrical parasitics associated with the wire bond connections.

In addition, wire bonding makes packaging two-dimensional (2-D) arrays problematic by precluding the possibility of producing optical transmitters and receivers with a large number of parallel channels, such as, for example, greater than 24. Applications that require high communication bandwidth, such as data buses within computer systems or switches/routers used for telecommunications, require optical modules with a large number of transmitter and receiver channels that are each capable of operating at speeds in excess of ten Gb/s.

Moreover, GaAs and InP substrates, which are typically used as the starting material for producing photodiodes and VCSELs, are not transparent to a wavelength at substantially 850 nanometers (nm). This 850 nm wavelength, which is an industry standard, is technologically important because low-cost GaAs-based devices may be used for the lasers and detectors. For this reason, 850 nm wavelength optical data links are commonly utilized by many institutions, agencies, organizations, enterprises, and premises wiring applications that support networks, such as, for example, local area networks (LANs) or storage area networks (SANs).

Therefore, it would be beneficial to have an improved optical transceiver module that is compact, scalable, and compatible with operation of VCSELs and photodiodes at a wavelength of 850 nm.

SUMMARY OF THE INVENTION

Illustrative embodiments provide an improved optical transceiver module. The optical transceiver module includes a printed circuit board and an opto-chip. The opto-chip includes a transparent carrier with an optoelectronic device array and an associated integrated circuit array that are flip chip attached to the transparent carrier. The optoelectronic device array and the associated integrated circuit array are interconnected via surface wiring with bond sites. In addition, the associated integrated circuit array extends beyond the transparent carrier to provide direct flip chip attachment of the opto-chip to the printed circuit board.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
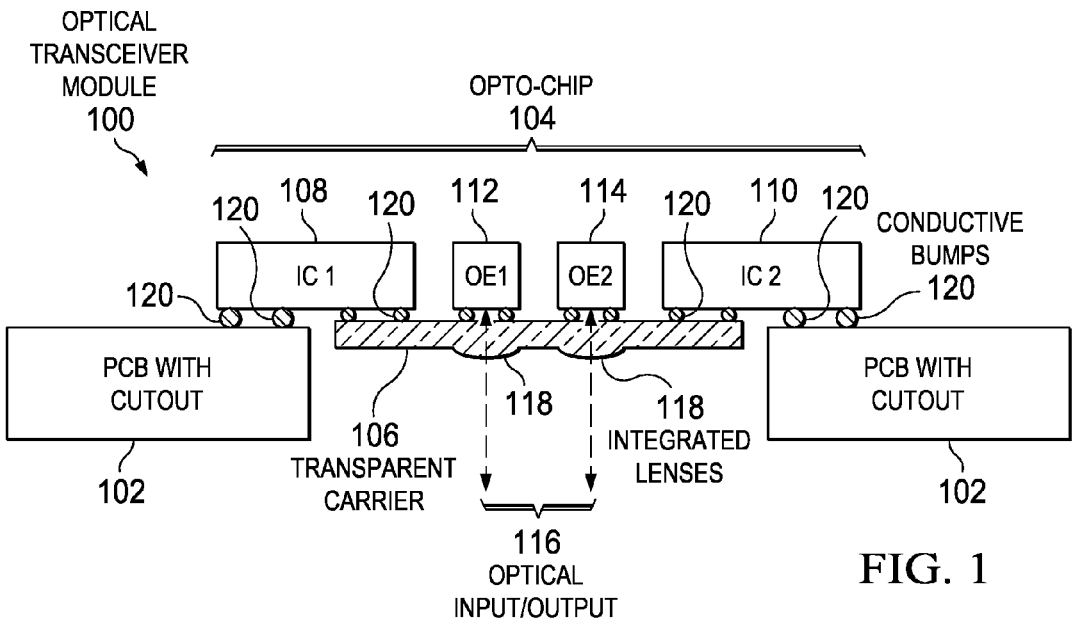
FIG. 1 is a block diagram of a side edge view of an optical transceiver module in which illustrative embodiments may be implemented.

With reference now to the figures and in particular with reference to FIG. 1, an exemplary block diagram of an optical module apparatus is provided in which illustrative embodiments may be implemented. It should be appreciated that FIG. 1 is only exemplary and is not intended to assert or imply any limitation with regard to different illustrative embodiments. Many modifications to the depicted optical module may be made.

FIG. 1 depicts a block diagram of a side edge view of an optical transceiver module in which illustrative embodiments may be implemented. Optical transceiver module 100 is an electrical and optical component that is capable of transmitting and receiving pulses of light, which are used to communicate data. Optical transceiver module 100 includes printed circuit board (PCB) 102 and opto-chip 104.

PCB 102 mechanically supports and electronically connects electronic components, such as opto-chip 104, to other electronic components. PCB 102 may, for example, be an organic carrier, which is similar to conventional chip carriers. PCB 102 may also be a ceramic carrier. In addition, PCB 102 may include a conventional ball grid array (BGA) of bond pads on its bottom surface for surface mounting to, for example, a motherboard (shown in the illustrative example of FIG. 9). Furthermore, PBC 102 may incorporate other electronic chips, such as, for example, microprocessors or control chips, in addition to opto-chip 104.

PCB 102 includes an area that is cutout or devoid of structure. Typically, the cutout is a square or rectangular area surrounded by PCB 102 on all four sides. However, it should be noted that the cutout area may be any regular or irregular geometric shape and may not be entirely surrounded by PCB 102. For example, the cutout area may only be surrounded by PCB 102 on three sides or two sides depending on whether the cutout is on an edge or a corner of PCB 102. PCB 102 utilizes the cutout area to accommodate a portion or all of the structure of opto-chip 104.

Opto-chip 104 is a chip-like device that is flip chip attached to PCB 102. Opto-chip 104 includes transparent carrier 106, IC 1 108, IC 2 110, OE 1 112, and OE 2 114. Transparent carrier 106 is a substrate that electronic devices, such as IC 1 108, IC 2 110, OE 1 112, and OE 2 114 may connect to. IC 1 108 and IC 2 110 extend beyond the dimensions of transparent carrier 106 to provide bond pads for electrical I/O to and from PCB 102.

In addition, transparent carrier 106 is transparent to pulses of light, such as optical I/O 116. In this illustrative example, transparent carrier 106 is made of glass or fused silica. However, it should be noted that transparent carrier 106 may be made of any transparent material capable of accomplishing processes of illustrative embodiments.

Further, transparent carrier 106 includes electrical lines (shown in the illustrative example of FIG. 3), which provide connectivity between IC 1 108 and OE 1 112 and IC 2 110 and OE 2 114. Furthermore, lenses, such as integrated lenses 118, may be integrated into transparent carrier 106 to provide more efficient optical coupling between the OEs and optical fibers or optical circuits. In addition, integrated lenses 118 may provide for greater coupling distances between the OEs and the optical fibers or optical circuits by focusing the pulses of light to the OEs.

Opto-chip 104 includes arrays of OE devices, such as, for example, vertical cavity surface emitting lasers (VCSELs) or photodiodes, and ICs, such as, for example, complementary metal-oxide-semiconductor (CMOS) laser drivers or CMOS receiver chips. The ICs may also be implemented in other circuit technologies, such as, for example, GaAs, InP, silicon (Si) bipolar, or gallium nitride (GaN) technologies. Even though only two OEs and two ICs are shown in this illustrative example, illustrative embodiments are not limited to such. Illustrative embodiments may include more or fewer OEs and ICs as needed by alternative illustrative embodiments.

In this illustrative example, OE 1 112 is a VCSEL. As a result, opto-chip 104 uses OE 1 112 as a transmitter to output pulses of light. Consequently, IC 1 108 is a laser driver, such as, for example, a CMOS laser driver. Opto-chip 104 uses IC 1 108 to modulate the output of light pulses to represent ones and zeros for communicating data.

Also, in this illustrative example, OE 2 114 is a photodiode. As a result, opto-chip 104 uses OE 2 114 to receive light pulses as input. Consequently, IC 2 110 is a receiver chip, such as, for example, a CMOS receiver chip, that converts the received light pulses into electrical signals.

IC 1 108, IC 2 110, OE 1 112, and OE 2 114 are flip chip attached to transparent carrier 106. Flip chip offers increased high speed electrical performance. Flip chip is one type of mounting used for semiconductor devices, such as ICs and OEs, which does not require any wire bonds. Eliminating bond wires may reduce the delaying inductance and capacitance of a connection by a factor of ten and may shorten an electrical path by a factor of 25 to 100. The result is a higher speed interconnection.

IC 1 108, IC 2 110, OE 1 112, and OE 2 114 electronically connect to PCB 102 and/or transparent carrier 106 via conductive bumps 120. Conductive bumps 120 may, for example, be solder bumps, gold balls, molded studs, or electrically conductive plastics. Conductive bumps 120 connect directly to the associated external circuitry. This type of mounting is also known as the Controlled Collapse Chip Connection, or C4. Also, this type of mounting leaves a small space between the chip's circuitry and the underlying substrate or mounting.

An electrically-insulating adhesive may be "under filled" in this small space to provide a stronger mechanical connection, provide a heat bridge, and to ensure conductive bumps 120 are not stressed due to differential heating of opto-chip 104 and PCB 102. The resulting completed assembly (i.e., optical transceiver module 100) is much smaller than a traditional carrier-based system, both in terms of area and height, because opto-chip 104 sits directly on PCB 102.

Thus, illustrative embodiments provide very short electrical traces between the OEs and ICs on the transparent substrate, while simultaneously enabling the direct flip chip attachment of the resulting opto-chip assembly directly to a PCB or flex circuit. This aspect of the invention allows the optical transceiver module to be attached to a circuit board in a manner similar to that employed for electronic components in high-volume, low-cost, surface-mount board technologies. In addition, the exclusive use of flip chip packaging allows the complete assembly to operate at high speeds, such as, for example, greater than ten Gb/s, with a high density of integrated channels.

As a result, illustrative embodiments provide low-cost, small-footprint, parallel optical transmitters, receivers, or transceivers based on 850 nm wavelength OE devices. The exclusive use of flip chip packaging to attach both the amplifier and OE chips to a transparent substrate minimizes the footprint of the assembled module, as well as the parasitic inductance and capacitance incurred in the connections between chips. This allows the production of optical modules with many parallel channels and also maximizes the speed that may be obtained for each individual channel.

Figure 2:
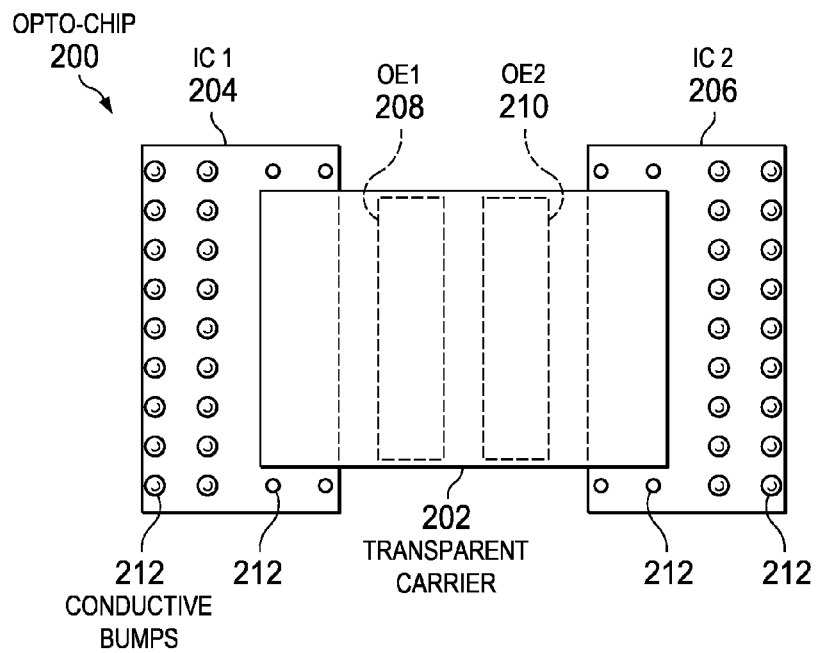
FIG. 2 is a block diagram of a bottom view of an opto-chip in accordance with an illustrative embodiment.

With reference now to FIG. 2, a block diagram of a bottom view of an opto-chip is depicted in accordance with an illustrative embodiment. Opto-chip 200 may, for example, be opto-chip 104 in FIG. 1. Opto-chip 200 includes transparent carrier 202, IC 1 204, IC 2 206, OE 1 208, and OE 2 210, such as, for example, transparent carrier 106, IC 1 108, IC 2 110, OE 1 112, and OE 2 114 in FIG. 1.

It should be noted that opto-chip 200 in this illustrative example is being viewed from the underside. As a result, conductive bumps 212 for IC 1 204 and IC 2 206 that connect opto-chip 200 to a PCB, such as PCB 102 in FIG. 1, are visible. Conductive bumps 212 may, for example, be conductive bumps 120 in FIG. 1.

Figure 3:
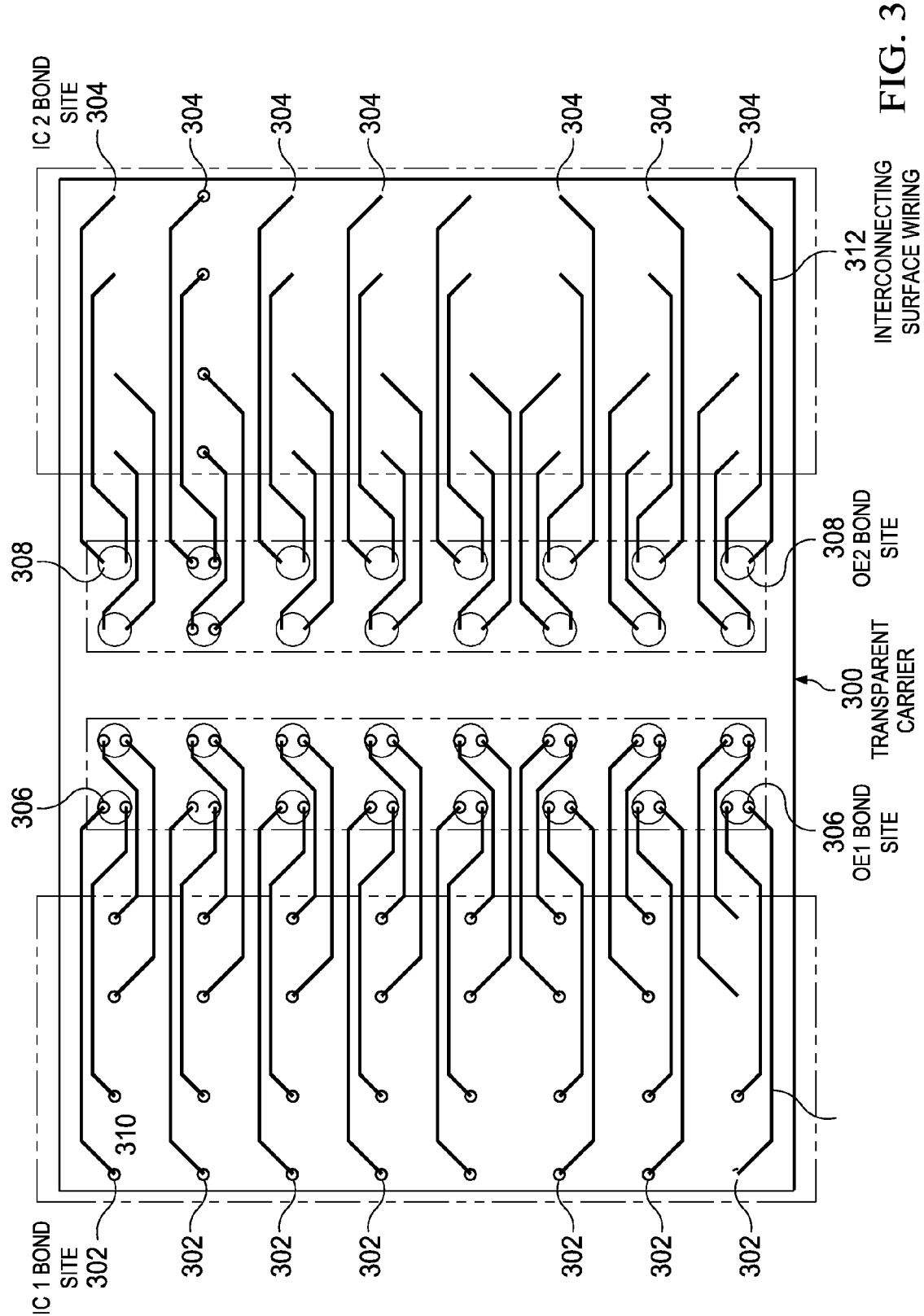
FIG. 3 is an exemplary illustration of a top view of a transparent carrier in accordance with an illustrative embodiment.

With reference now to FIG. 3, an exemplary illustration of a top view of a transparent carrier is depicted in accordance with an illustrative embodiment. Transparent carrier 300 may, for example, be transparent carrier 106 in FIG. 1. Transparent carrier 300 includes IC 1 bond sites 302, IC 2 bond sites 304, OE 1 bond sites 306, and OE 2 bond sites 308.

IC 1 bond sites 302 and IC 2 bond sites 304 provide the bonding sites for ICs, such as IC 1 108 and IC 2 110 in FIG. 1, to transparent carrier 300. The ICs connect to transparent carrier 300 via conductive bumps, such as conductive bumps 120 in FIG. 1, which are positioned over the bond sites and then re-melted. Similarly, OE 1 bond sites 306 and OE 2 bond sites 308 provide the bonding sites for OEs, such as OE 1 112 and OE 2 114 in FIG. 1, to transparent carrier 300. The OEs connect to transparent carrier 300 via conductive bumps as well.

Further, it should be noted that IC 1 bond sites 302 and OE 1 bond sites 306 are electrically connected via interconnecting surface wiring 310. Similarly, IC 2 bond sites 304 and OE 2 bond sites 308 are electrically connected via interconnecting surface wiring 312. As a result, associated ICs and OEs that are flip chip attached to transparent carrier 300 are electrically coupled together. Illustrative embodiments utilize transparent carrier 300 to provide short, high-speed electrical links between ICs, such as CMOS laser drivers or receiver chips, and their associated OEs, such as VCSELs or photodiodes. The I/O between the ICs and the rest of the system are established through direct flip chip attachment to a PCB, such as PCB 102 in FIG. 1.

In an alternative embodiment, transparent carrier 300 may include multi-layered interconnecting wiring between ICs and OEs. This multi-layered interconnecting wiring may allow for IC and OE arrays of, for example, 4×8 or 6×8, instead of just 2×8 as shown in this illustrative example. In addition, it should be noted that illustrative embodiments are not limited to only eight rows of ICs and OEs. Illustrative embodiments may utilize any number combination of columns to rows.

Furthermore, it should be noted that transparent carrier 300 includes integrated lenses, such as integrated lens 118 in FIG. 1, which are depicted as shaded areas around OE 1 bond sites 306 and OE 2 bond sites 308. The integrated lenses are located on the bottom side of transparent carrier 300. Transparent carrier 300 uses the integrated lenses to focus light pulses, such as optical I/O 116 in FIG. 1, to the OEs attached to transparent carrier 300.

Figure 4:
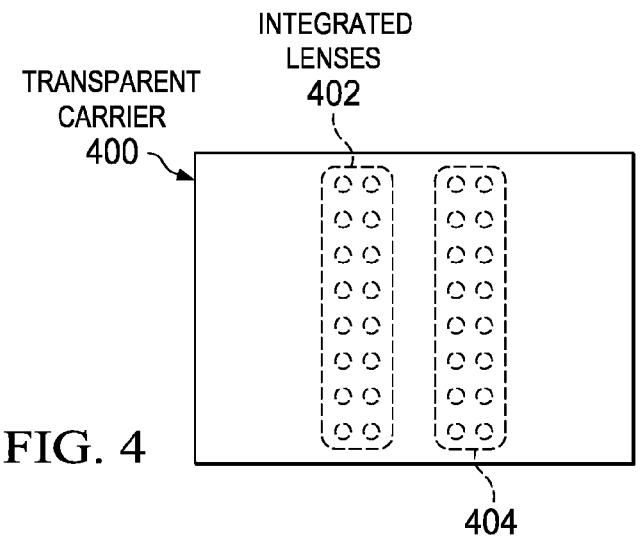
FIG. 4 is an exemplary illustration of a bottom view of a transparent carrier in accordance with an illustrative embodiment.

With reference now to FIG. 4, an exemplary illustration of a bottom view of a transparent carrier is depicted in accordance with an illustrative embodiment. Transparent carrier 400 may, for example, be transparent carrier 300 in FIG. 3. Transparent carrier 400 includes integrated lenses 402 and integrated lenses 404, such as integrated lenses 118 in FIG. 1, which are integrated into the bottom surface of transparent carrier 400.

In this illustrative example, integrated lenses 402 are in a 2×8 array. However, it should be noted that illustrative embodiments may use any type of integrated lens array. This 2×8 array of lenses shown in this illustrative example corresponds to a 2×8 array of OEs flip chip attached to the top surface of transparent carrier 400.

Figure 5:
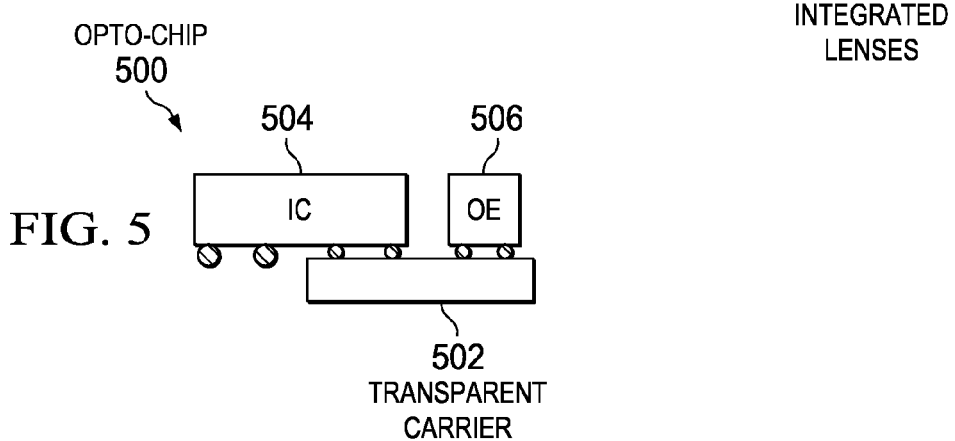
FIG. 5 is a block diagram of a side edge view of a separate transmitter or receiver opto-chip in which illustrative embodiments may be implemented.

With reference now to FIG. 5, a block diagram of a side edge view of a separate transmitter or receiver opto-chip is depicted in which illustrative embodiments may be implemented. Opto-chip 500 includes transparent carrier 502, IC 504, and OE 506, such as, for example, transparent carrier 106, IC 1 108, and OE 1 112 in FIG. 1. In this illustrative example, opto-chip 500 may be used as either a transmitter or a receiver depending upon the type of component flip chip attached to transparent carrier 502. For example, IC 504 may be a CMOS laser driver and OE 506 may be a VCSEL, which in this case opto-chip 500 is a transmitter of optical pulses to optical circuits or optical fibers. Alternatively, IC 504 may be a CMOS receiver chip and OE 506 may be a photodiode, which in this case opto-chip 500 is a receiver of optical pulses from the optical circuits or fibers. Also, it should be noted that opto-chip 500 may include a 1×N array of ICs and OEs.

Figure 6:
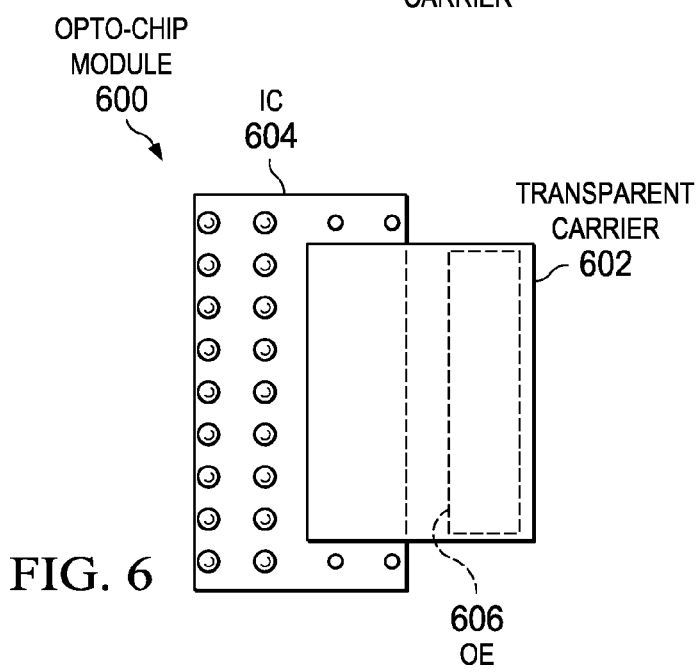
FIG. 6 is a block diagram of a bottom view of a separate transmitter or receiver opto-chip in which illustrative embodiments may be implemented.

With reference now to FIG. 6, a block diagram of a bottom view of a separate transmitter or receiver opto-chip is depicted in which illustrative embodiments may be implemented. Opto-chip 600 may, for example, be opto-chip 500 in FIG. 5. Opto-chip 600 includes transparent carrier 602, IC 604, and OE 606, such as, for example, transparent carrier 502, IC 504, and OE 506 in FIG. 5. This illustrative example provides a bottom side view of opto-chip 600, which is an opposing view to the illustrative example provided in FIG. 5.

Figure 7:
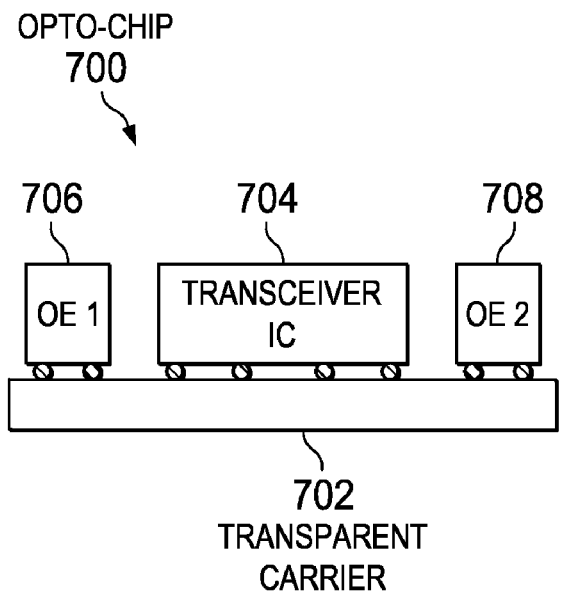
FIG. 7 is a block diagram of a side edge view of a transceiver opto-chip with one transceiver IC and two OEs in which illustrative embodiments may be implemented.

With reference now to FIG. 7, a block diagram of a side edge view of a transceiver opto-chip with one transceiver IC and two OEs is depicted in which illustrative embodiments may be implemented. Opto-chip 700 includes transparent carrier 702, transceiver IC 704, OE 1 706, and OE 2 708. Transparent carrier 702, OE 1 706, and OE 2 708 may, for example, be transparent carrier 106, OE 1 108, and OE 2 110 in FIG. 1. Transceiver IC 704 is a single IC that includes both a transmitter, such as a CMOS laser driver, and a receiver, such as a CMOS receiver chip, for OE 1 706 and OE 2 708.

Figure 8:
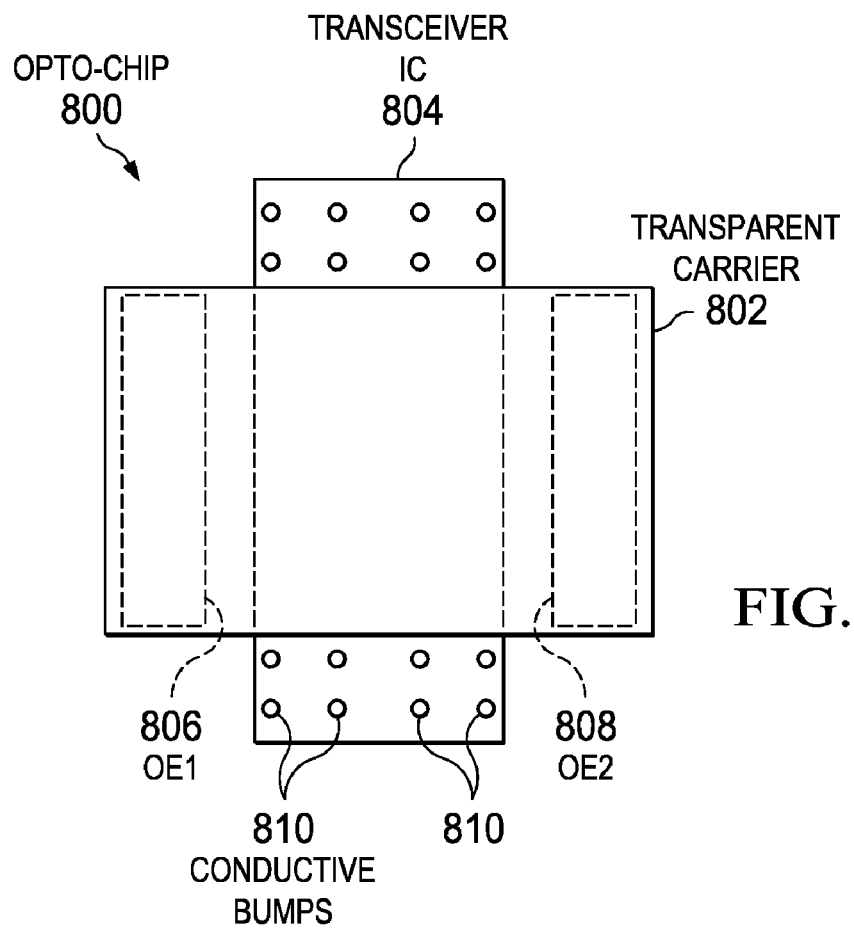
FIG. 8 is a block diagram of a bottom view of a transceiver opto-chip with one transceiver IC and two OEs in which illustrative embodiments may be implemented.

With reference now to FIG. 8, a block diagram of a bottom view of a transceiver opto-chip with one transceiver IC and two OEs is depicted in which illustrative embodiments may be implemented. Opto-chip 800 may, for example, be opto-chip 700 in FIG. 7. Opto-chip 800 includes transparent carrier 802, transceiver IC 804, OE 1 806, and OE 2 808, such as, for example, transparent carrier 702, transceiver IC 704, OE 1 706, and OE 2 708 in FIG. 7. In addition, this illustrative example shows conductive bumps 810, such as conductive bumps 208 in FIG. 2, which are attached to the bottom side of transceiver IC 804. Transceiver IC 804 uses conductive bumps 810 to flip chip attach to a PCB, such as, for example, PCB 102 in FIG. 1.

Figure 9:
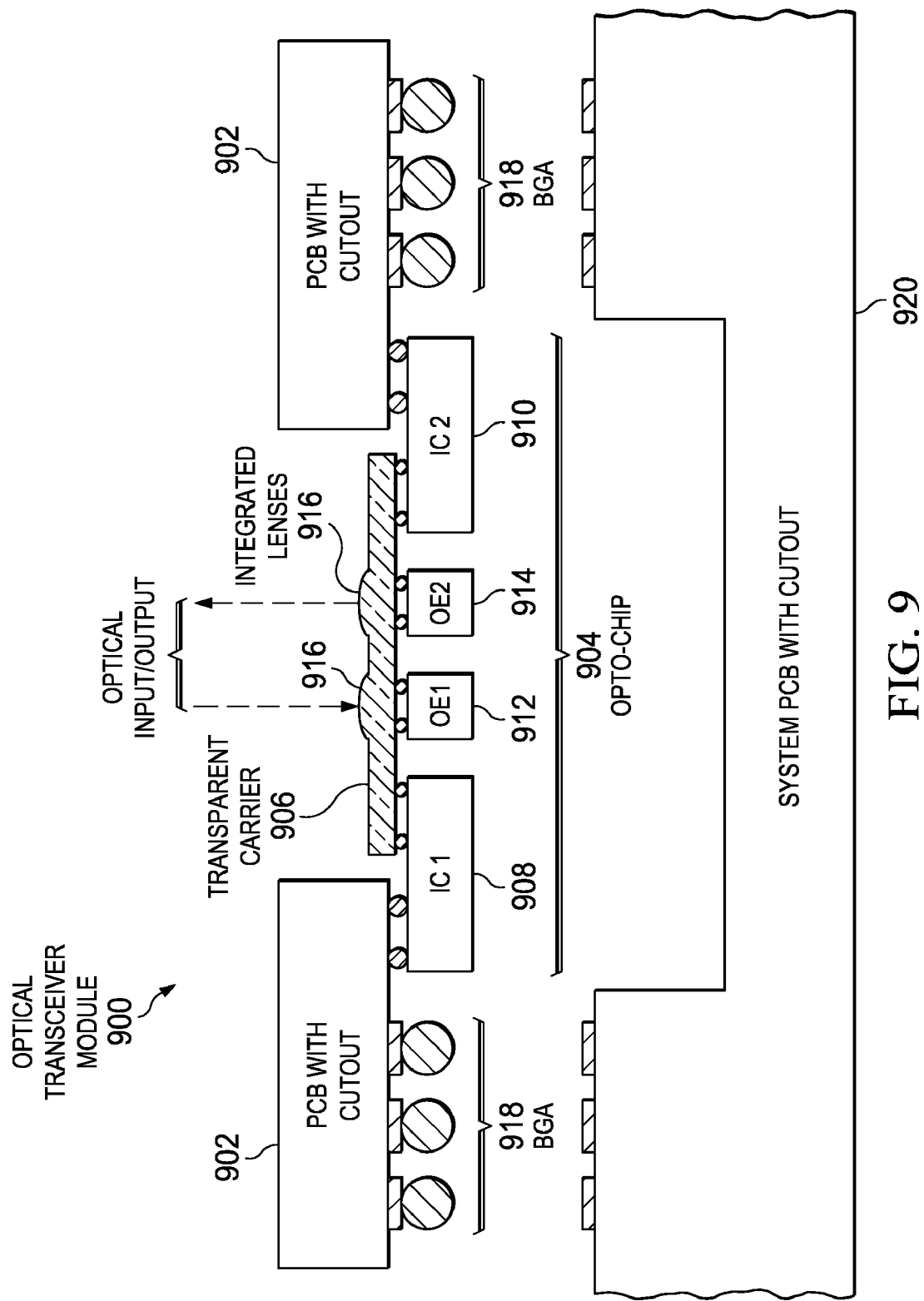
FIG. 9 is a block diagram of a side edge view of an optical transceiver module with a bottom mounted opto-chip in which illustrative embodiments may be implemented.

With reference now to FIG. 9, a block diagram of a side edge view of an optical transceiver module with a bottom mounted opto-chip is depicted in which illustrative embodiments may be implemented. Optical transceiver module 900 may, for example, be optical transceiver module 100 in FIG. 1. Optical transceiver module 900 includes PCB 902 and opto-chip 904, such as, for example, PCB 102 and opto-chip 104 in FIG. 1. However, it should be noted that opto-chip 904 is flip chip attached to the bottom side of PCB 902, whereas opto-chip 104 is flip chip attached to the top side of PCB 102 in FIG. 1.

PCB 902 includes a cutout area to accommodate a portion of opto-chip 902. Opto-chip 904 includes transparent carrier 906, IC 1 908, IC 2 910, OE 1 912, and OE 2 914. Transparent carrier 906 includes integrated lenses 916, which provide more efficient optical coupling between OE 1 912 and OE 2 914 and optical fibers.

Optical transceiver module 900 also includes BGA 918. BGA 918 is an array of bond pads on the bottom surface of PCB 902 for surface mounting to system PCB 920. System PCB 920 may, for example, be a motherboard. In addition, system PCB 920 also includes a cutout area to accommodate a portion of bottom mounted opto-chip 904.

Thus, illustrative embodiments provide an improved optical transceiver module. The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An optical module comprising:
    an opto-chip including:
        a substrate that is transparent, the substrate including electrical lines and lenses integrated therein;
        an array of optoelectronic devices mounted flip chip to the transparent substrate;
        an array of integrated circuits associated with the array of optoelectronic devices that are mounted flip chip to the transparent substrate,
        wherein the optoelectronic device array and the associated integrated circuit array are interconnected via the electrical lines in the transparent substrate, and
        wherein a portion of the integrated circuit array extends beyond a dimension of the transparent substrate; and
    a printed circuit board that is mounted flip chip on a first side to the portion of the integrated circuit array of the opto-chip.

2. The optical module of claim 1, wherein the printed circuit board includes a cutout, and wherein the cutout accommodates a portion of the opto-chip.

3. The optical module of claim 1, wherein the opto-chip is mounted flip chip to one of a bottom surface of the printed circuit board and a top surface of the printed circuit board.

4. The optical module of claim 1, wherein the transparent substrate is a carrier that is one of glass and fused silica.

5. The optical module of claim 4, wherein the transparent substrate is transparent to a laser wavelength.

6. The optical module of claim 1, wherein the flip chip mount is a Controlled Collapse Chip Connection.

7. The optical module of claim 1, wherein the lenses are integrated into a bottom surface of the transparent substrate and optically couples the optoelectronic device array to one of optical fibers and optical circuits.

8. The optical module of claim 1, wherein the transparent substrate includes multi-layered interconnecting wiring between the optoelectronic device array and the integrated circuit array.

9. The optical module of claim 1, wherein the optoelectronic device array is an array of vertical cavity surface emitting lasers, and wherein the associated integrated circuit array is an array of CMOS laser drivers.

10. The optical module of claim 1, wherein the optoelectronic device array is an array of photodiodes, and wherein the associated integrated circuit array is an array of CMOS receiver chips.

11. The optical module of claim 1, wherein devices in the optoelectronic device array share an associated transceiver integrated circuit.

12. The optical module of claim 1, wherein the printed circuit board includes a ball grid array on a second side to mount.

* * * * *